(12) United States Patent
Tu

(10) Patent No.: US 10,777,609 B1
(45) Date of Patent: Sep. 15, 2020

(54) OPTICAL DEVICES WITH LIGHT COLLECTION ELEMENTS FORMED IN PIXELS

(71) Applicant: VisEra Technologies Company Limited, Hsin-Chu (TW)

(72) Inventor: Zong-Ru Tu, Zhubei (TW)

(73) Assignee: VISERA TECHNOLOGIES COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/371,634

(22) Filed: Apr. 1, 2019

(51) Int. Cl.
*H01L 27/30* (2006.01)
*H01L 51/44* (2006.01)
*G02B 5/20* (2006.01)

(52) U.S. Cl.
CPC ............ *H01L 27/307* (2013.01); *G02B 5/20* (2013.01); *H01L 51/447* (2013.01)

(58) Field of Classification Search
None
See application file for complete search history.

(56) References Cited

U.S. PATENT DOCUMENTS

| | | | |
|---|---|---|---|
| 8,816,358 B1* | 8/2014 | Tsai ............... | H01L 27/307 257/79 |
| 10,170,510 B2* | 1/2019 | Park .............. | H01L 31/02165 |
| 10,483,309 B1* | 11/2019 | Lee .............. | H01L 27/14627 |
| 2015/0286060 A1* | 10/2015 | Roh .............. | G02B 27/12 250/226 |
| 2016/0141321 A1* | 5/2016 | Hsieh ............ | H01L 27/14621 250/216 |
| 2019/0043908 A1* | 2/2019 | Tamai ............ | G01J 3/513 |

* cited by examiner

*Primary Examiner* — J. E. Schoenholtz
(74) *Attorney, Agent, or Firm* — Muncy, Geissler, Olds & Lowe, P.C.

(57) ABSTRACT

An optical device is provided. The optical device includes a central region having a plurality of central pixels, a first region having a plurality of first pixels, a second region having a plurality of second pixels, an organic layer formed in the central region, the first region and the second region, a light collection layer surrounded by the organic layer formed in the first region and the second region, a first light collection element of the light collection layer formed in the first pixel, and a second light collection element of the light collection layer formed in the second pixel. The central region, the first region and the second region are spaced from each other along an arrangement direction, and the first region is closer to the central region than the second region. The first light collection element is different from the second light collection element.

18 Claims, 12 Drawing Sheets

OPTICAL DEVICES WITH LIGHT COLLECTION ELEMENTS FORMED IN PIXELS

BACKGROUND OF THE INVENTION

Field of the Invention

The invention relates to an optical device, and more particularly to an optical device with light collection elements of different dimensions or positions formed above color filters.

Description of the Related Art

In an optical device with a composite metal grid (CMG)-type structure, a microlens is required above the color filters. In an optical device with a wave guide color filter (WGCF)-type structure, a low-refractive-index material surrounding the color filters is used instead of a microlens to form a wave guide structure.

However, in an optical device with a wave guide color filter (WGCF)-type structure, due to the absorption of oblique light by metal grids, the quantum effect (QE) of the current pixel drops, especially for pixels located in the peripheral region of the substrate.

Therefore, development of an optical device with a wave guide color filter (WGCF)-type structure capable of improving the QE spectrum is desirable.

BRIEF SUMMARY OF THE INVENTION

In accordance with one embodiment of the invention, an optical device is provided. The optical device includes a central region having a plurality of central pixels, a first region having a plurality of first pixels, a second region having a plurality of second pixels, an organic layer formed in the central region, the first region and the second region, a light collection layer surrounded by the organic layer formed in the first region and the second region, a first light collection element of the light collection layer formed in the first pixel, and a second light collection element of the light collection layer formed in the second pixel. The central region, the first region and the second region are spaced from each other along an arrangement direction. The first region is closer to the central region than the second region. The first light collection element is different from the second light collection element.

In some embodiments, there is a first distance between a center of the first pixel and a center of the first light collection element. There is a second distance between a center of the second pixel and a center of the second light collection element. In some embodiments, the second distance is greater than the first distance. The center of the first light collection element departs from the center of the first pixel along a direction opposite to the arrangement direction of the central region, the first region and the second region. The center of the second light collection element departs from the center of the second pixel along the direction opposite to the arrangement direction of the central region, the first region and the second region.

In some embodiments, the first distance is the same as the second distance. In some embodiments, the second light collection element has a width which is greater than that of the first light collection element. In some embodiments, the width of the first light collection element is greater than zero. The width of the second light collection element is less than a width of the second pixel. In some embodiments, the second light collection element has an upper surface area which is greater than that of the first light collection element. In some embodiments, the second light collection element has a thickness which is greater than that of the first light collection element. In some embodiments, the thickness of the second light collection element is greater than that of the organic layer. In some embodiments, the first light collection element and the second light collection element are further covered by the organic layer. In some embodiments, a part of the second light collection element extends further into a color filter underneath the second light collection element. In some embodiments, the part of the second light collection element that extends into the color filter has a thickness that is less than one third of that of the color filter.

In some embodiments, the second light collection element has a width which is greater than that of the first light collection element. The second light collection element has a thickness which is greater than that of the first light collection element. In some embodiments, the second light collection element extends further over a patterned organic layer surrounding a color filter underneath the second light collection element. In some embodiments, the patterned organic layer has a refractive index which is in a range from about 1.2 to about 1.45.

In some embodiments, the first light collection element and the second light collection element have a refractive index which is greater than those of color filters respectively underneath the first light collection element and the second light collection element. In some embodiments, the first light collection element and the second light collection element have a refractive index which is in a range from about 1.6 to about 1.9. In some embodiments, the optical device further includes an anti-reflection layer formed on the organic layer, the first light collection element and the second light collection element. In some embodiments, the first light collection element and the second light collection element have a refractive index which is greater than that of the anti-reflection layer.

In the present invention, high-refractive-index (n=1.6-1.9) light collection elements with specific dimensions or positions are disposed above color filters. For the dimension requirement, the width (or thickness) of the light collection element disposed in the pixel far from the central pixel is greater than that of the light collection element disposed in the pixel adjacent to the central pixel. For the position requirement, the distance between the central point of the pixel and the central point of the light collection element (i.e. the departure distance of the light collection element from the central point of the pixel) in the pixel far from the central pixel is greater than that between the central point of the pixel and the central point of the light collection element in the pixel adjacent to the central pixel. Specifically, the departure direction of the light collection elements is opposite to the pixel-arrangement direction. Also, the departure direction of the light collection elements in the pixels is correspondingly altered in accordance with various pixel-arrangement directions. In addition, the refractive index of the light collection element is higher than that of adjacent materials. By disposing the specific light collection element, QE peaks of color filters are thus significantly improved, especially for pixels located in the peripheral region of the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
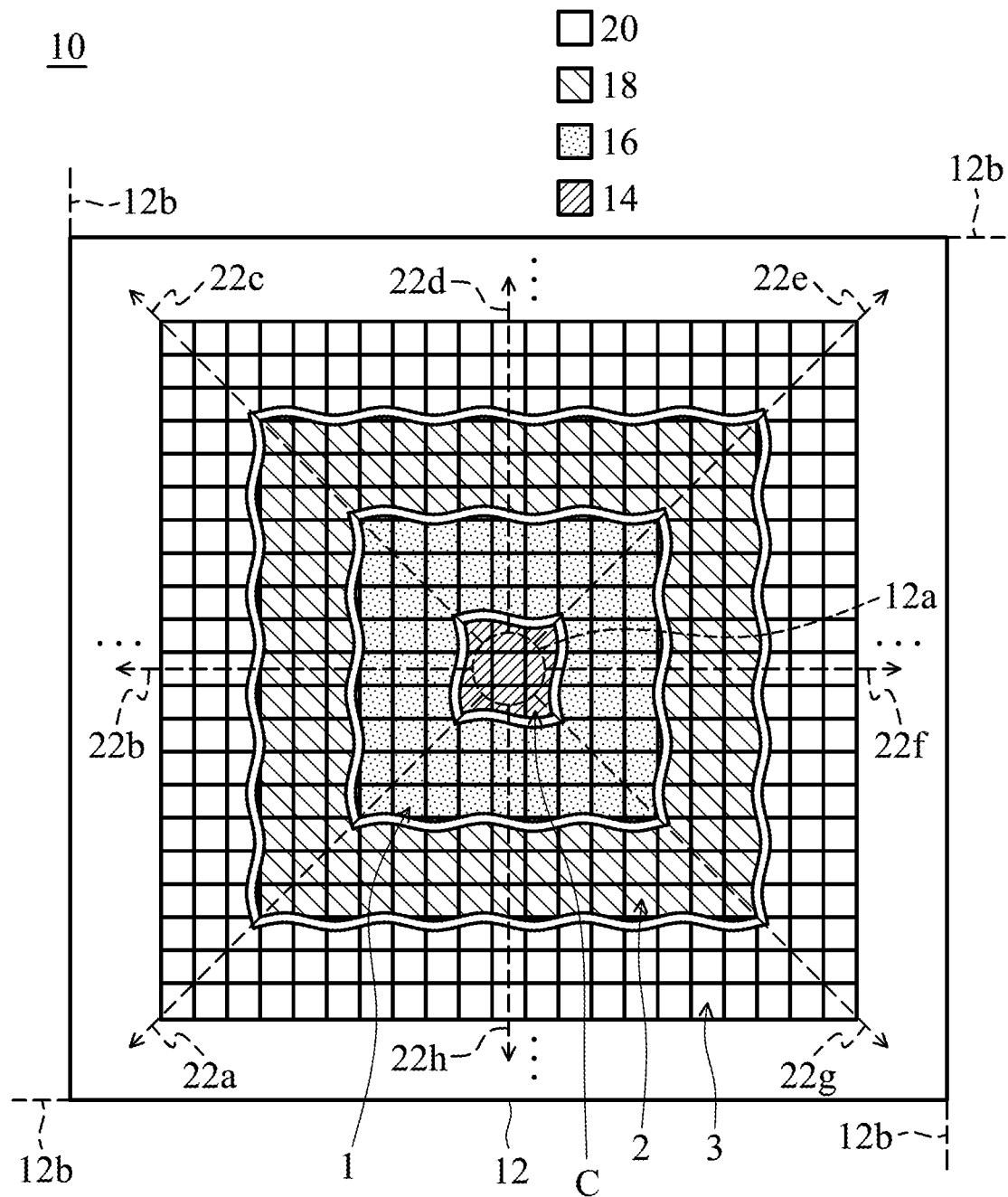
FIG. 1 is a top view of pixel arrangement of an optical device in accordance with one embodiment of the invention.
Figure 2:
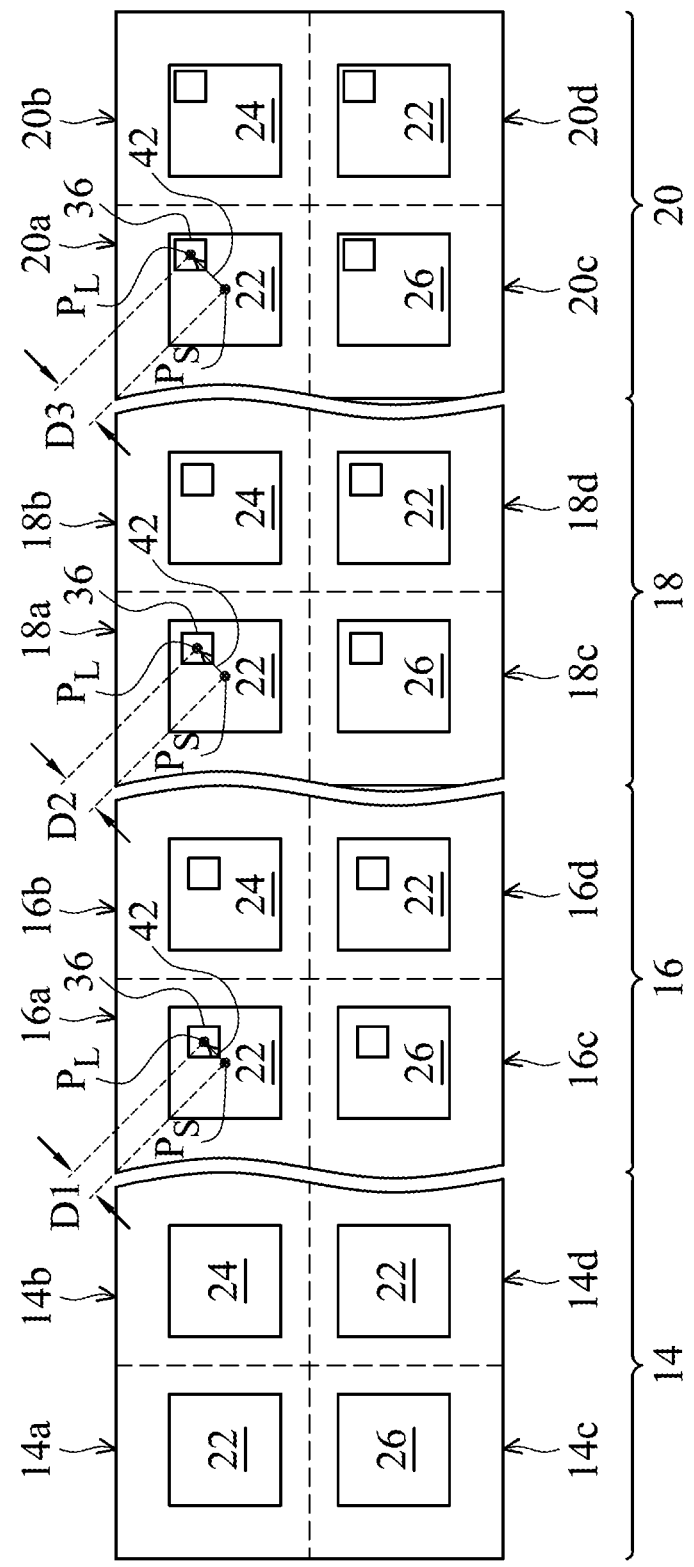
FIG. 2 is a top view of the pixel structures of an optical device in accordance with one embodiment of the invention.
Figure 3:
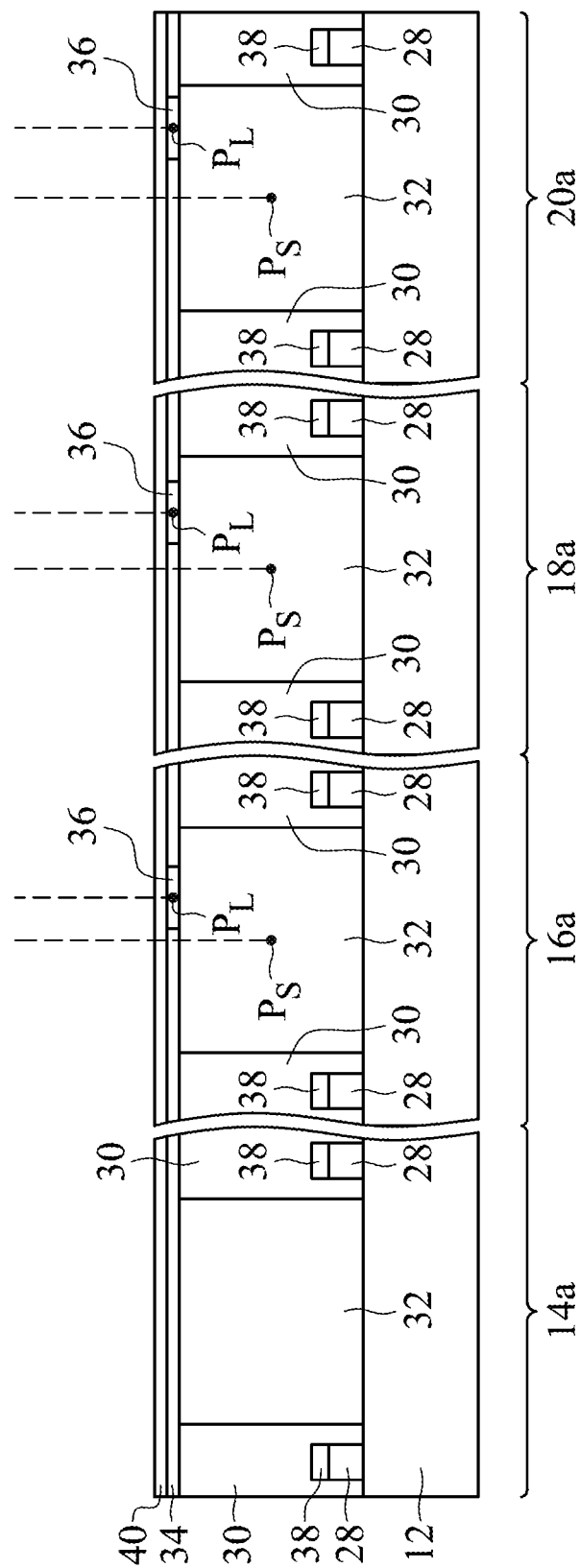
FIG. 3 is a cross-sectional view of the pixel structures of an optical device in accordance with one embodiment of the invention.

Referring to FIGS. 1-3, in accordance with one embodiment of the invention, an optical device 10 is provided. FIG. 1 is a top view of pixel arrangement of the optical device 10. FIG. 2 is a top view of the pixel structures of the optical device 10. FIG. 3 is a cross-sectional view of the pixel structures of the optical device 10.

In FIGS. 1 and 2, the optical device 10 includes a substrate 12 which includes a central region 14, a first region 16, a second region 18 and a third region 20. The central region 14, the first region 16, the second region 18 and the third region 20 are spaced from each other. The first region 16 is closer to the central region 14 than the second region 18. The second region 18 is closer to the first region 16 than the third region 20. The central region 14 has a plurality of central pixels, for example 14a, 14b, 14c and 14d. The first region 16 has a plurality of first pixels, for example 16a, 16b, 16c and 16d. The second region 18 has a plurality of second pixels, for example 18a, 18b, 18c and 18d. The third region 20 has a plurality of third pixels, for example 20a, 20b, 20c and 20d. The central pixels (ex. 14a, 14b, 14c and 14d) in the central region 14, the first pixels (ex. 16a, 16b, 16c and 16d) in the first region 16, the second pixels (ex. 18a, 18b, 18c and 18d) in the second region 18, and the third pixels (ex. 20a, 20b, 20c and 20d) in the third region 20 are arranged along a pixel-arrangement direction that is a direction from a center 12a towards an edge 12b of the substrate 12, for example, various pixel-arrangement directions (22a, 22b, 22c, 22d, 22e, 22f, 22g and 22h), as shown in FIG. 1. The pixel-arrangement direction 22a represents the direction in which the pixels are arranged diagonally from the center to the bottom left of the substrate 12. The pixel-arrangement direction 22b represents the direction in which the pixels are arranged horizontally (along x-axis) from the center to the left of the substrate 12. The pixel-arrangement direction 22c represents the direction in which the pixels are arranged diagonally from the center to the top left of the substrate 12. The pixel-arrangement direction 22d represents the direction in which the pixels are arranged perpendicularly (along y-axis) from the center to the top of the substrate 12. The pixel-arrangement direction 22e represents the direction in which the pixels are arranged diagonally from the center to the top right of the substrate 12. The pixel-arrangement direction 22f represents the direction in which the pixels are arranged horizontally (along x-axis) from the center to the right of the substrate 12. The pixel-arrangement direction 22g represents the direction in which the pixels are arranged diagonally from the center to the bottom right of the substrate 12. The pixel-arrangement direction 22h represents the direction in which the pixels are arranged perpendicularly (along y-axis) from the center to the bottom of the substrate 12. Here, the arrangement of the central pixels (ex. 14a, 14b, 14c and 14d), the first pixels (ex. 16a, 16b, 16c and 16d), the second pixels (ex. 18a, 18b, 18c and 18d), and the third pixels (ex. 20a, 20b, 20c and 20d) along the pixel-arrangement direction 22a is exemplary.

In FIG. 2, the central pixel 14a, the first pixel 16a, the second pixel 18a and the third pixel 20a include green (G) color filters 22. The central pixel 14b, the first pixel 16b, the second pixel 18b and the third pixel 20b include red (R) color filters 24. The central pixel 14c, the first pixel 16c, the second pixel 18c and the third pixel 20c include blue (B) color filters 26. The central pixel 14d, the first pixel 16d, the second pixel 18d and the third pixel 20d include green (G) color filters 22. In some embodiments, other arrangements of the R/G/B color filters (22, 24 and 26) in the pixels are also suitable in the present invention. Here, the central pixel 14a, the first pixel 16a, the second pixel 18a and the third pixel 20a are exemplary for demonstrating various pixel structures thereamong.

Referring to FIGS. 2 and 3, the central pixel 14a includes a plurality of metal grids 28, a patterned first organic layer 30, a color filter 32, and a second organic layer 34. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. Each of the first pixel 16a, the second pixel 18a and the third pixel 20a includes a plurality of metal grids 28, a patterned first organic layer 30, a color filter 32, a second organic layer 34, and a light collection element 36. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. The light collection element 36 is surrounded by the second organic layer 34. Specifically, the refractive index of the light collection element 36 is greater than that of the second organic layer 34. Therefore, no light collection element is disposed in the central pixel 14a. In addition, for the first pixel 16a, the second pixel 18a and the third pixel 20a, a first distance "D1" between the central point "$P_S$" of the first pixel 16a and the central point "$P_L$" of the light collection element 36 is defined. A second distance "D2" between the central point "$P_S$" of the second pixel 18a and the central point "$P_L$" of the light collection element 36 is defined. A third distance "D3" between the central point "$P_S$" of the third pixel 20a and the central point "$P_L$" of the light collection element 36 is defined.

In FIGS. 2 and 3, the first distance "D1", the second distance "D2" and the third distance "D3" are different thereamong. Referring to FIG. 2, the central point "$P_L$" of the light collection element 36 in the first pixel 16a departs from the central point "$P_S$" of the first pixel 16a along a direction 42. The central point "$P_L$" of the light collection element 36 in the second pixel 18a departs from the central point "$P_S$" of the second pixel 18a along the direction 42. The central point "$P_L$" of the light collection element 36 in the third pixel 20a departs from the central point "$P_S$" of the third pixel 20a along the direction 42. Specifically, the departure direction 42 represents the direction in which the central points "$P_L$" of the light collection elements 36 depart diagonally from the central points "$P_S$" towards the top right of the first pixel 16a, the second pixel 18a and the third pixel 20a respectively. Here, the central pixel 14a, the first pixel 16a, the second pixel 18a, and the third pixel 20a are arranged along the pixel-arrangement direction 22a (i.e. a direction that the pixels are arranged diagonally from the center to the bottom left of the substrate 12), as shown in FIG. 1. Therefore, the departure direction 42 of the light collection elements 36 is opposite to the pixel-arrangement direction 22a.

The departure direction 42 of the light collection elements 36 correspondingly alters in accordance with various pixel-arrangement directions to ensure that the departure direction of the light collection element is opposite to the pixel-arrangement direction. In some embodiments, when the central pixel 14a, the first pixel 16a, the second pixel 18a, and the third pixel 20a are arranged along the pixel-arrangement direction 22b (i.e. a direction in which the pixels are arranged horizontally (along x-axis) from the center to the left of the substrate 12), the central points "$P_L$" of the light collection elements 36 depart horizontally from the central points "$P_S$" towards the right of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22c (i.e. a direction in which the pixels are arranged diagonally from the center to the top left of the substrate 12), the central points "$P_L$" of the light collection elements 36 depart diagonally from the central points "$P_S$" towards the bottom right of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22d (i.e. a direction in which the pixels are arranged perpendicularly (along y-axis) from the center to the top of the substrate 12), the central points "$P_L$" of the light collection elements 36 depart perpendicularly from the central points "$P_S$" towards the bottom of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22e (i.e. a direction in which the pixels are arranged diagonally from the center to the top right of the substrate 12), the central points "$P_L$" of the light collection elements 36 depart diagonally from the central points "$P_S$" towards the bottom left of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22f (i.e. a direction in which the pixels are arranged horizontally (along x-axis) from the center to the right of the substrate 12), the central points "$P_L$" of the light collection elements 36 depart horizontally from the central points "$P_S$" towards the left of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22g (i.e. a direction in which the pixels are arranged diagonally from the center to the bottom right of the substrate 12), the central points "$P_L$" of the light collection elements 36 depart diagonally from the central points "$P_S$" towards the top left of the first pixel 16a, the second pixel 18a and the third pixel 20a respectively. In some embodiments, when the central pixel 14a, the first pixel 16a, the second pixel 18a, and the third pixel 20a are arranged along the pixel-arrangement direction 22h (i.e. a direction in which the pixels are arranged perpendicularly (along y-axis) from the center to the bottom of the substrate 12), the central points "$P_L$" of the light collection elements 36 depart perpendicularly from the central points "$P_S$" towards the top of the first pixel 16a, the second pixel 18a and the third pixel 20a respectively.

In FIGS. 2 and 3, the third distance "D3" in the third pixel 20a is greater than the second distance "D2" in the second pixel 18a. The second distance "D2" in the second pixel 18a is greater than the first distance "D1" in the first pixel 16a. The first distance "D1" in the first pixel 16a is greater than zero.

In some embodiments, the patterned first organic layer 30 has a refractive index which is in a range from about 1.2 to about 1.45. In some embodiments, the refractive index of the light collection element 36 is greater than that of the color filter 32. In some embodiments, the refractive index of the light collection element 36 is in a range from about 1.6 to about 1.9. In some embodiments, each of the central pixel 14a, the first pixel 16a, the second pixel 18a and the third pixel 20a further includes an oxide layer 38 which covers the metal grids 28. In some embodiments, each of the central pixel 14a, the first pixel 16a, the second pixel 18a and the third pixel 20a further includes an anti-reflection layer 40 formed on the second organic layer 34. In some embodiments, the refractive index of the light collection element 36 is greater than that of the anti-reflection layer 40.

Figure 4:
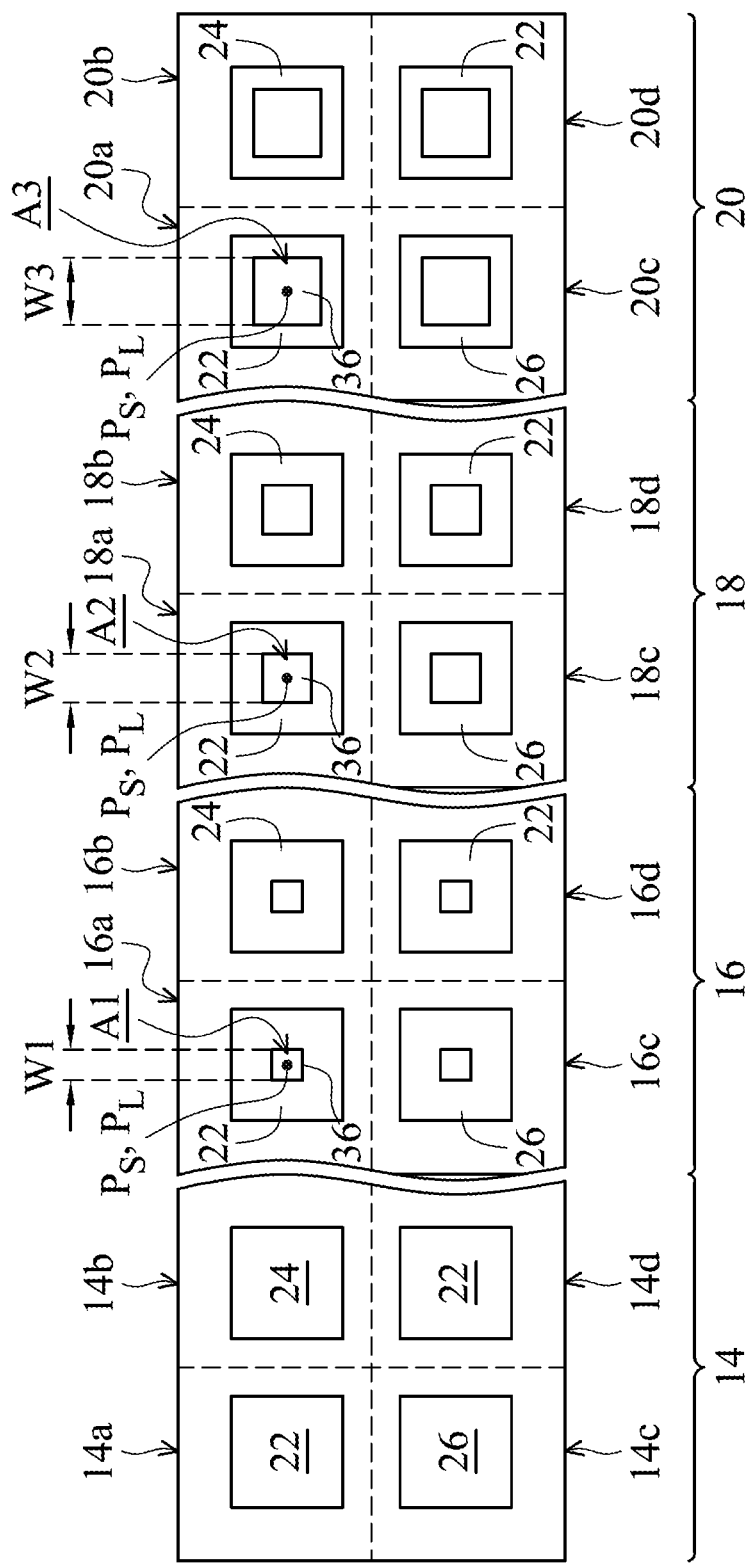
FIG. 4 is a top view of the pixel structures of an optical device in accordance with one embodiment of the invention.
Figure 5:
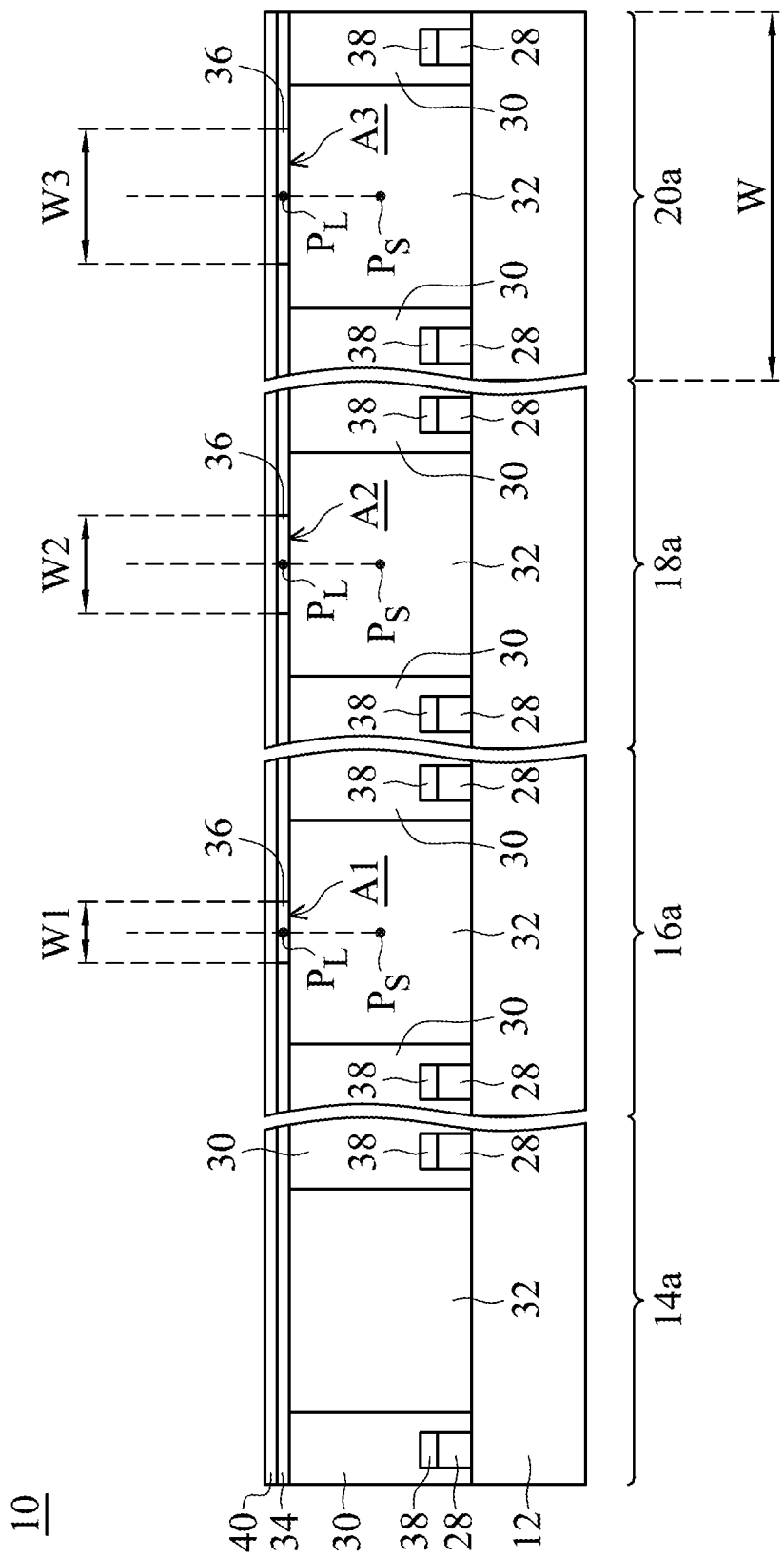
FIG. 5 is a cross-sectional view of the pixel structures of an optical device in accordance with one embodiment of the invention.

Referring to FIGS. 1, 4 and 5, in accordance with another embodiment of the invention, an optical device 10 is provided. FIG. 4 is a top view of the pixel structures of the optical device 10. FIG. 5 is a cross-sectional view of the pixel structures of the optical device 10.

In FIG. 1, similarly, the arrangement of the central pixels (ex. 14a, 14b, 14c and 14d), the first pixels (ex. 16a, 16b, 16c and 16d), the second pixels (ex. 18a, 18b, 18c and 18d), and the third pixels (ex. 20a, 20b, 20c and 20d) along the pixel-arrangement direction 22a is exemplary.

In FIG. 4, the central pixel 14a, the first pixel 16a, the second pixel 18a and the third pixel 20a include green (G) color filters 22. The central pixel 14b, the first pixel 16b, the second pixel 18b and the third pixel 20b include red (R) color filters 24. The central pixel 14c, the first pixel 16c, the second pixel 18c and the third pixel 20c include blue (B)

color filters 26. The central pixel 14d, the first pixel 16d, the second pixel 18d and the third pixel 20d include green (G) color filters 22. In some embodiments, other arrangements of the R/G/B color filters (22, 24 and 26) in the pixels are also suitable in the present invention. Here, the central pixel 14a, the first pixel 16a, the second pixel 18a and the third pixel 20a are exemplary for demonstrating various pixel structures thereamong.

Referring to FIGS. 4 and 5, the central pixel 14a includes a plurality of metal grids 28, a patterned first organic layer 30, a color filter 32, and a second organic layer 34. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. Each of the first pixel 16a, the second pixel 18a and the third pixel 20a includes a plurality of metal grids 28, a patterned first organic layer 30, a color filter 32, a second organic layer 34, and a light collection element 36. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. The light collection element 36 is surrounded by the second organic layer 34. Specifically, the refractive index of the light collection element 36 is greater than that of the second organic layer 34. Therefore, no light collection element is disposed in the central pixel 14a. In addition, for the first pixel 16a, the second pixel 18a and the third pixel 20a, a first distance between the central point "$P_S$" of the first pixel 16a and the central point "$P_L$" of the light collection element 36 is defined. A second distance between the central point "$P_S$" of the second pixel 18a and the central point "$P_L$" of the light collection element 36 is defined. A third distance between the central point "$P_S$" of the third pixel 20a and the central point "$P_L$" of the light collection element 36 is defined.

In FIGS. 4 and 5, the first distance, the second distance and the third distance are zero. Referring to FIG. 4, the central point "$P_L$" of the light collection element 36 in the first pixel 16a and the central point "$P_S$" of the first pixel 16a overlap. The central point "$P_L$" of the light collection element 36 in the second pixel 18a and the central point "$P_S$" of the second pixel 18a overlap. The central point "$P_L$" of the light collection element 36 in the third pixel 20a and the central point "$P_S$" of the third pixel 20a overlap. That is, there is no departure of the central points "$P_L$" of the light collection elements 36 from the central points "$P_S$" of the first pixel 16a, the second pixel 18a and the third pixel 20a respectively.

In FIGS. 4 and 5, for the first pixel 16a, the second pixel 18a and the third pixel 20a, a first width "W1" of the light collection element 36 in the first pixel 16a is defined. A second width "W2" of the light collection element 36 in the second pixel 18a is defined. A third width "W3" of the light collection element 36 in the third pixel 20a is defined. Specifically, the third width "W3" of the light collection element 36 in the third pixel 20a is greater than the second width "W2" of the light collection element 36 in the second pixel 18a. The second width "W2" of the light collection element 36 in the second pixel 18a is greater than the first width "W1" of the light collection element 36 in the first pixel 16a. In some embodiments, the first width "W1" of the light collection element 36 in the first pixel 16a is greater than zero. The third width "W3" of the light collection element 36 in the third pixel 20a is smaller than the width "W" of the third pixel 20a. In addition, a first area "A1" of the light collection element 36 in the first pixel 16a is defined. A second area "A2" of the light collection element 36 in the second pixel 18a is defined. A third area "A3" of the light collection element 36 in the third pixel 20a is defined. Similarly, the third area "A3" of the light collection element 36 in the third pixel 20a is greater than the second area "A2" of the light collection element 36 of the second pixel 18a. The second area "A2" of the light collection element 36 of the second pixel 18a is greater than the first area "A1" of the light collection element 36 of the first pixel 16a.

In some embodiments, the patterned first organic layer 30 has a refractive index which is in a range from about 1.2 to about 1.45. In some embodiments, the refractive index of the light collection element 36 is greater than that of the color filter 32. In some embodiments, the refractive index of the light collection element 36 is in a range from about 1.6 to about 1.9. In some embodiments, each of the central pixel 14a, the first pixel 16a, the second pixel 18a and the third pixel 20a further includes an oxide layer 38 which covers the metal grids 28. In some embodiments, each of the central pixel 14a, the first pixel 16a, the second pixel 18a and the third pixel 20a further includes an anti-reflection layer 40 formed on the second organic layer 34. In some embodiments, the refractive index of the light collection element 36 is greater than that of the anti-reflection layer 40.

Figure 6:
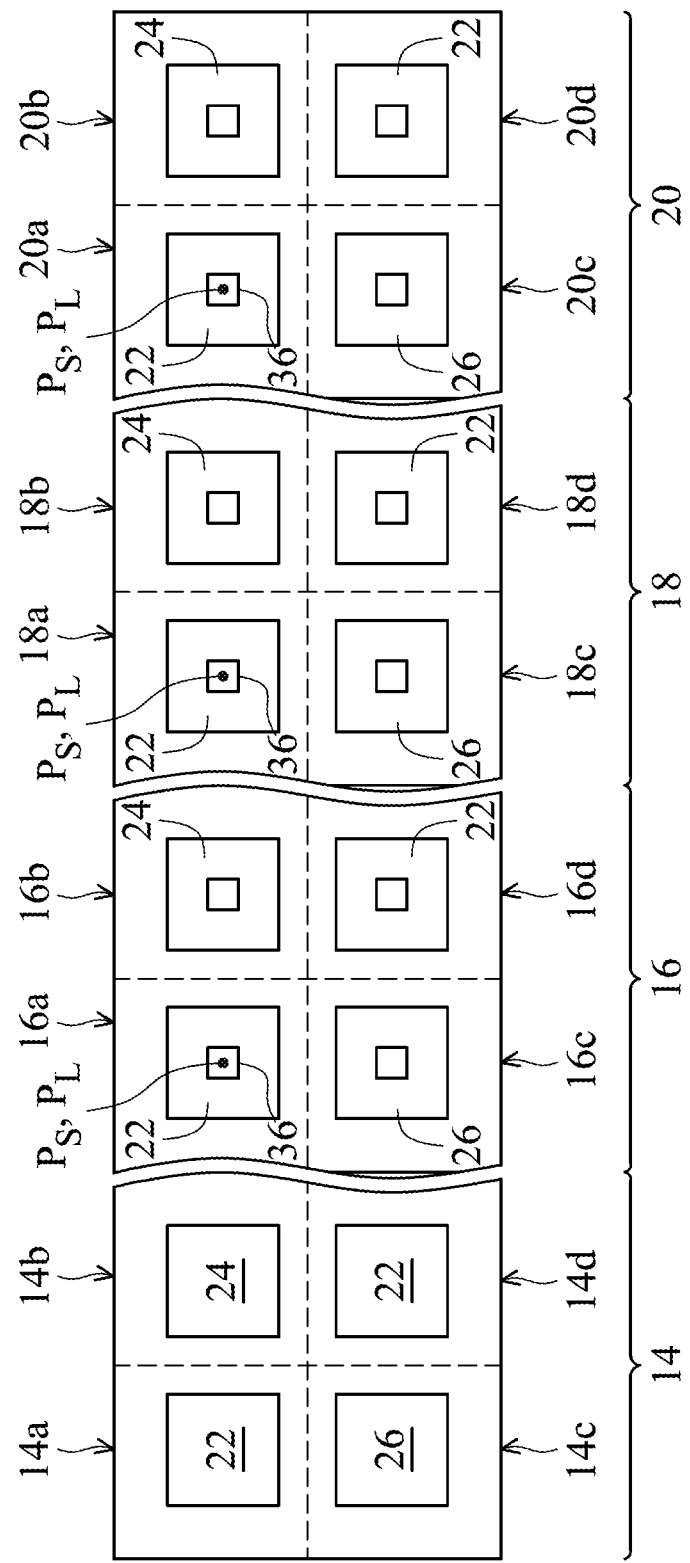
FIG. 6 is a top view of the pixel structures of an optical device in accordance with one embodiment of the invention.
Figure 7:
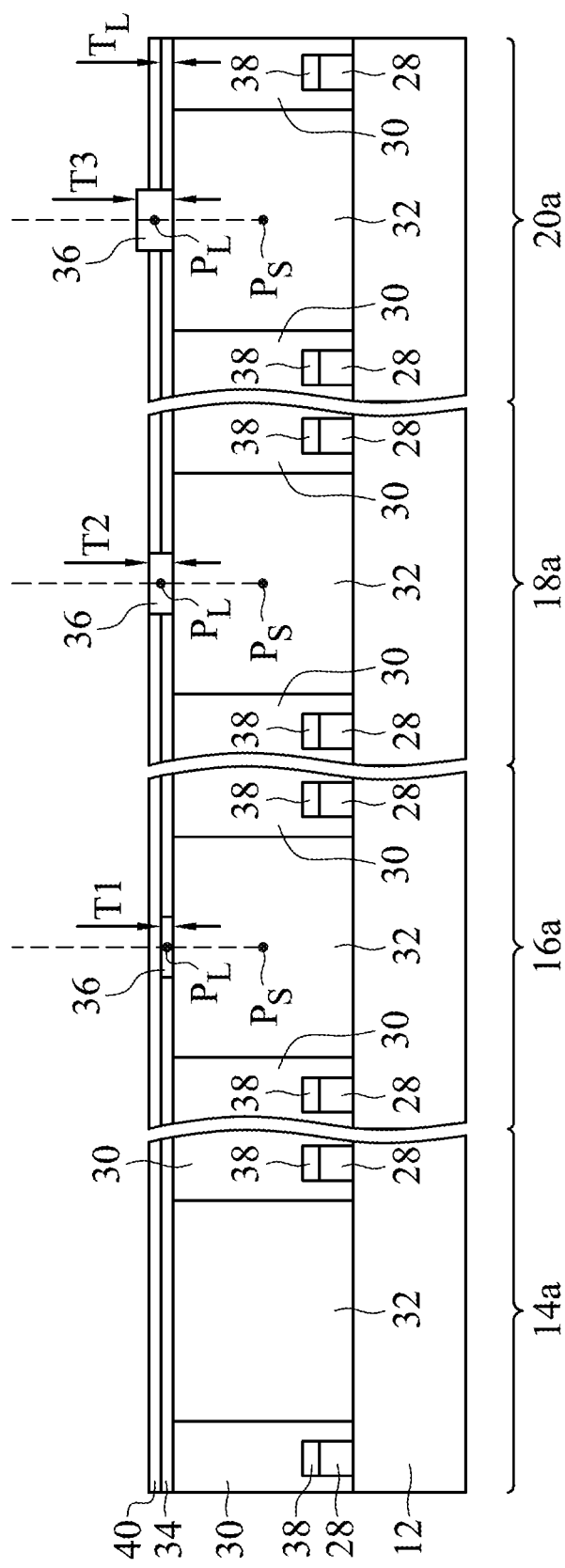
FIG. 7 is a cross-sectional view of the pixel structures of an optical device in accordance with one embodiment of the invention.

Referring to FIGS. 1, 6 and 7, in accordance with another embodiment of the invention, an optical device 10 is provided. FIG. 6 is a top view of the pixel structures of the optical device 10. FIG. 7 is a cross-sectional view of the pixel structures of the optical device 10.

In FIG. 1, similarly, the arrangement of the central pixels (ex. 14a, 14b, 14c and 14d), the first pixels (ex. 16a, 16b, 16c and 16d), the second pixels (ex. 18a, 18b, 18c and 18d), and the third pixels (20a, 20b, 20c and 20c) along the pixel-arrangement direction 22a is exemplary.

In FIG. 6, the central pixel 14a, the first pixel 16a, the second pixel 18a and the third pixel 20a include green (G) color filters 22. The central pixel 14b, the first pixel 16b, the second pixel 18b and the third pixel 20b include red (R) color filters 24. The central pixel 14c, the first pixel 16c, the second pixel 18c and the third pixel 20c include blue (B) color filters 26. The central pixel 14d, the first pixel 16d, the second pixel 18d and the third pixel 20d include green (G) color filters 22. In some embodiments, other arrangements of the R/G/B color filters (22, 24 and 26) in the pixels are also suitable in the present invention. Here, the central pixel 14a, the first pixel 16a, the second pixel 18a and the third pixel 20a are exemplary for demonstrating various subpixel structures thereamong.

Referring to FIGS. 6 and 7, the central pixel 14a includes a plurality of metal grids 28, a patterned first organic layer 30, a color filter 32, and a second organic layer 34. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. Each of the first pixel 16a, the second pixel 18a and the third pixel 20a includes a plurality of metal grids 28, a patterned first organic layer 30, a color filter 32, a second organic layer 34, and a light collection element 36. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. The light collection element 36 is surrounded by the second organic layer 34. Specifically, the refractive index of the light collection element 36 is greater than that of the second organic layer 34. Therefore, no light collection element is disposed in the central pixel 14a. In addition, for the first pixel 16a, the second pixel 18a and the third pixel 20a, a first distance between the central point "$P_S$" of the first pixel 16a and the central point "$P_L$" of the light collection element 36 is defined. A second distance between the central point "$P_S$" of the second pixel 18a and the central point "$P_L$" of the light collection element 36 is defined. A third distance between the central point "$P_S$" of the third pixel 20a and the central point "$P_L$" of the light collection element 36 is defined.

In FIGS. 6 and 7, the first distance, the second distance and the third distance are zero. Referring to FIG. 6, the central point "$P_L$" of the light collection element 36 in the first pixel 16a and the central point "$P_S$" of the first pixel 16a overlap. The central point "$P_L$" of the light collection element 36 in the second pixel 18a and the central point "$P_S$" of the second pixel 18a overlap. The central point "$P_L$" of the light collection element 36 in the third pixel 20a and the central point "$P_S$" of the third pixel 20a overlap. That is, there is no departure of the central points "$P_L$" of the light collection elements 36 from the central points "$P_S$" of the first pixel 16a, the second pixel 18a and the third pixel 20a respectively.

In FIG. 7, for the first pixel 16a, the second pixel 18a and the third pixel 20a, the first thickness "T1" of the light collection element 36 in the first pixel 16a is defined. The second thickness "T2" of the light collection element 36 in the second pixel 18a is defined. The third thickness "T3" of the light collection element 36 in the third pixel 20a is defined. Specifically, the third thickness "T3" of the light collection element 36 in the third pixel 20a is greater than the second thickness "T2" of the light collection element 36 in the second pixel 18a. The second thickness "T2" of the light collection element 36 in the second pixel 18a is greater than the first thickness "T1" of the light collection element 36 in the first pixel 16a. In FIG. 7, the second thickness "T2" of the light collection element 36 in the second pixel 18a is greater than the thickness "$T_L$" of the second organic layer 34. In some embodiments, the light collection elements 36 respectively in the first pixel 16a, the second pixel 18a and the third pixel 20a are further covered by the second organic layer 34 (not shown).

In some embodiments, the patterned first organic layer 30 has a refractive index which is in a range from about 1.2 to about 1.45. In some embodiments, the refractive index of the light collection element 36 is greater than that of the color filter 32. In some embodiments, the refractive index of the light collection element 36 is in a range from about 1.6 to about 1.9. In some embodiments, each of the central pixel 14a, the first pixel 16a, the second pixel 18a and the third pixel 20a further includes an oxide layer 38 which covers the metal grids 28. In some embodiments, each of the central pixel 14a, the first pixel 16a, the second pixel 18a and the third pixel 20a further includes an anti-reflection layer 40 formed on the second organic layer 34. In some embodiments, the refractive index of the light collection element 36 is greater than that of the anti-reflection layer 40.

Figure 8:
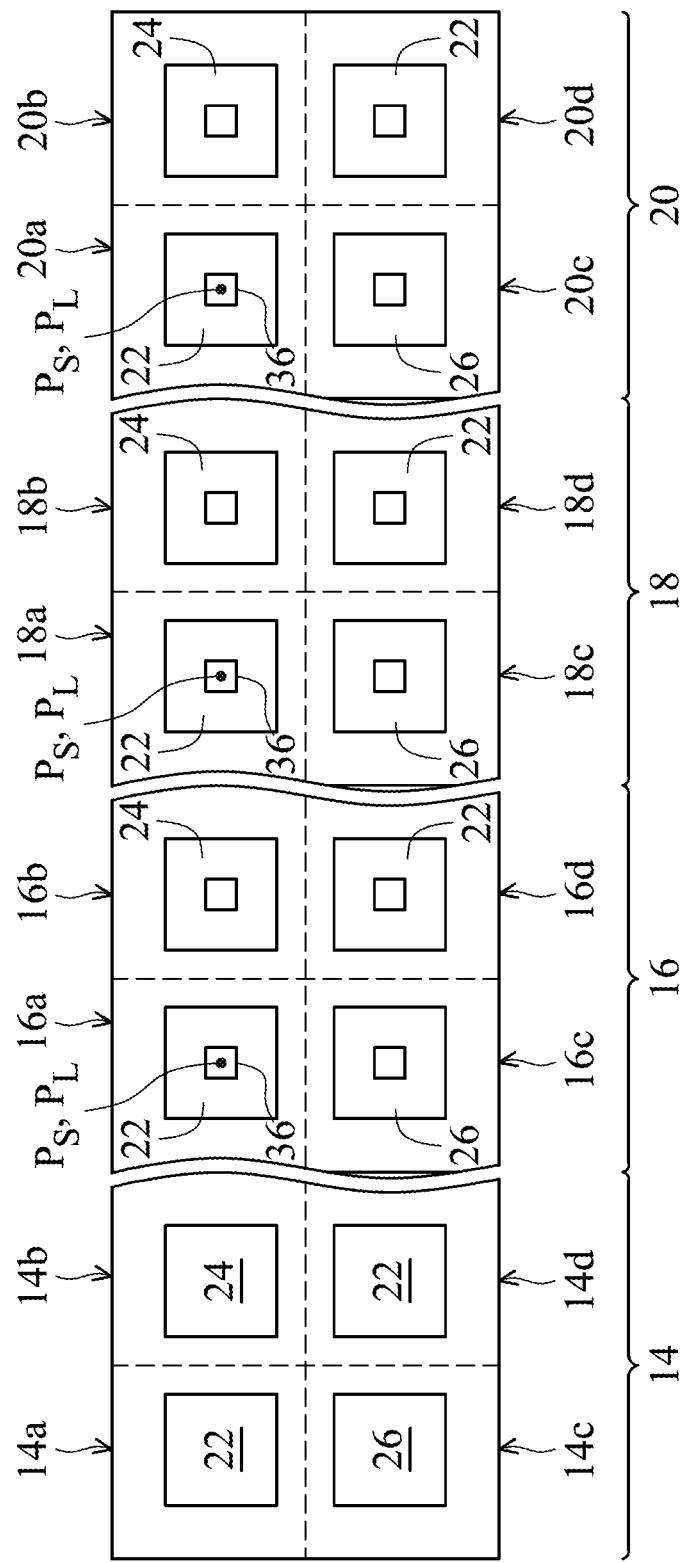
FIG. 8 is a top view of the pixel structures of an optical device in accordance with one embodiment of the invention.
Figure 9:
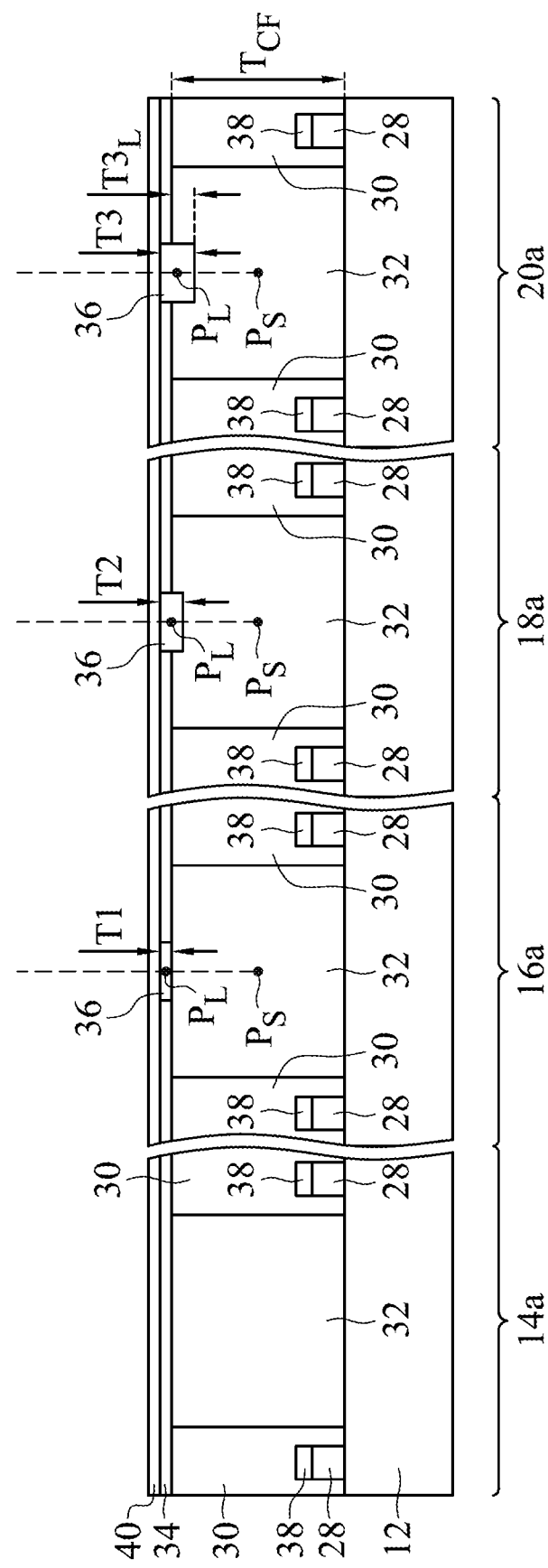
FIG. 9 is a cross-sectional view of the pixel structures of an optical device in accordance with one embodiment of the invention.

Referring to FIGS. 1, 8 and 9, in accordance with another embodiment of the invention, an optical device 10 is provided. FIG. 8 is a top view of the pixel structures of the optical device 10. FIG. 9 is a cross-sectional view of the pixel structures of the optical device 10.

In FIG. 1, similarly, the arrangement of the central pixels (ex. 14a, 14b, 14c and 14d), the first pixels (ex. 16a, 16b, 16c and 16d), the second pixels (ex. 18a, 18b, 18c and 18d), and the third pixels (ex. 20a, 20b, 20c and 20d) along the pixel-arrangement direction 22a is exemplary.

In FIG. 8, the central pixel 14a, the first pixel 16a, the second pixel 18a and the third pixel 20a include green (G) color filters 22. The central pixel 14b, the first pixel 16b, the second pixel 18b and the third pixel 20b include red (R) color filters 24. The central pixel 14c, the first pixel 16c, the second pixel 18c and the third pixel 20c include blue (B) color filters 26. The central pixel 14d, the first pixel 16d, the second pixel 18d and the third pixel 20d include green (G) color filters 22. In some embodiments, other arrangements of the R/G/B color filters (22, 24 and 26) in the pixels are also suitable in the present invention. Here, the central pixel 14a, the first pixel 16a, the second pixel 18a and the third pixel 20a are exemplary for demonstrating various subpixel structures thereamong.

Referring to FIGS. 8 and 9, the central pixel 14a includes a plurality of metal grids 28, a patterned first organic layer 30, a color filter 32, and a second organic layer 34. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. Each of the first pixel 16a, the second pixel 18a and the third pixel 20a includes a plurality of metal grids 28, a patterned first organic layer 30, a color filter 32, a second organic layer 34, and a light collection element 36. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. The light collection element 36 is surrounded by the second organic layer 34. Specifically, the refractive index of the light collection element 36 is greater than that of the second organic layer 34. Therefore, no light collection element is disposed in the central pixel 14a. In addition, for the first pixel 16a, the second pixel 18a and the third pixel 20a, a first distance between the central point "$P_S$" of the first pixel 16a and the central point "$P_L$" of the light collection element 36 is defined. A second distance between the central point "$P_S$" of the second pixel 18a and the central point "$P_L$" of the light collection element 36 is defined. A third distance between the central point "$P_S$" of the third pixel 20a and the central point "$P_L$" of the light collection element 36 is defined.

In FIGS. 8 and 9, the first distance, the second distance and the third distance are zero. Referring to FIG. 8, the central point "$P_L$" of the light collection element 36 in the first pixel 16a and the central point "$P_S$" of the first pixel 16a overlap. The central point "$P_L$" of the light collection element 36 in the second pixel 18a and the central point "$P_S$" of the second pixel 18a overlap. The central point "$P_L$" of the light collection element 36 in the third pixel 20a and the central point "$P_S$" of the third pixel 20a overlap. That is, there is no departure of the central points "$P_L$" of the light collection elements 36 from the central points "$P_S$" of the first pixel 16a, the second pixel 18a and the third pixel 20a respectively.

In FIG. 9, a part of the light collection element 36 in the second pixel 18a extends further into the color filter 32. Also, a part of the light collection element 36 in the third pixel 20a extends further into the color filter 32. For the first pixel 16a, the second pixel 18a and the third pixel 20a, the first thickness "T1" of the light collection element 36 in the first pixel 16a is defined. The second thickness "T2" of the light collection element 36 in the second pixel 18a is defined. The third thickness "T3" of the light collection element 36 in the third pixel 20a is defined. Specifically, the third thickness "T3" of the light collection element 36 in the third pixel 20a is greater than the second thickness "T2" of the light collection element 36 in the second pixel 18a. The second thickness "T2" of the light collection element 36 in the second pixel 18a is greater than the first thickness "T1" of the light collection element 36 in the first pixel 16a. In some embodiments, the thickness "$T3_L$" of the part of the light collection element 36 that extends into the color filter 32 is less than one third of the thickness "$T_{CF}$" of the color filter 32.

In some embodiments, the patterned first organic layer 30 has a refractive index which is in a range from about 1.2 to about 1.45. In some embodiments, the refractive index of the light collection element 36 is greater than that of the color filter 32. In some embodiments, the refractive index of the light collection element 36 is in a range from about 1.6 to about 1.9. In some embodiments, each of the central pixel 14a, the first pixel 16a, the second pixel 18a and the third pixel 20a further includes an oxide layer 38 which covers the metal grids 28. In some embodiments, each of the central pixel 14a, the first pixel 16a, the second pixel 18a and the third pixel 20a further includes an anti-reflection layer 40 formed on the second organic layer 34. In some embodiments, the refractive index of the light collection element 36 is greater than that of the anti-reflection layer 40.

Figure 10:
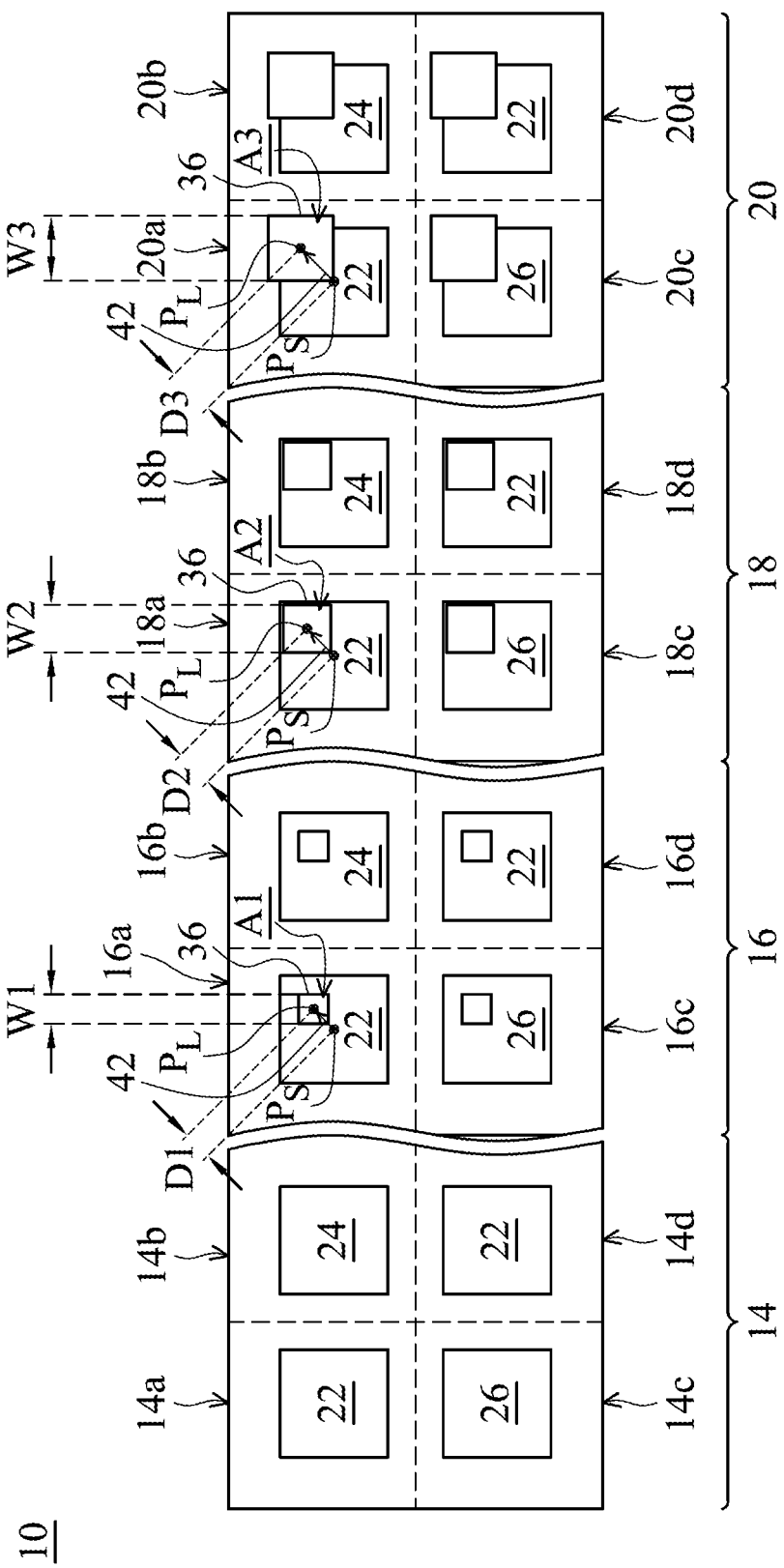
FIG. 10 is a top view of the pixel structures of an optical device in accordance with one embodiment of the invention.
Figure 11:
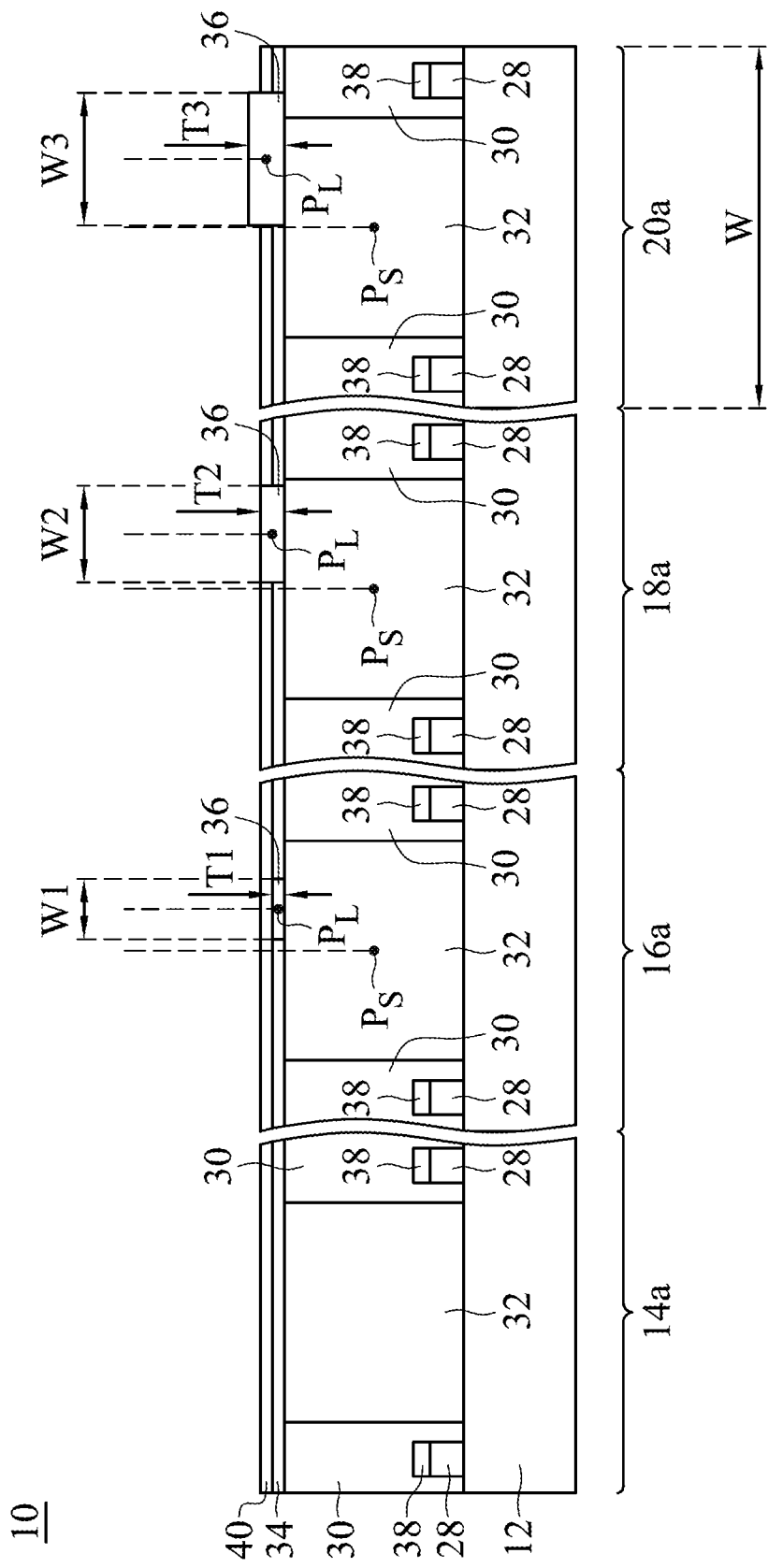
FIG. 11 is a cross-sectional view of the pixel structures of an optical device in accordance with one embodiment of the invention.

Referring to FIGS. 1, 10 and 11, in accordance with another embodiment of the invention, an optical device 10 is provided. FIG. 10 is a top view of the pixel structures of the optical device 10. FIG. 11 is a cross-sectional view of the pixel structures of the optical device 10.

In FIG. 1, similarly, the arrangement of the central pixels (ex. 14a, 14b, 14c and 14d), the first pixels (ex. 16a, 16b, 16c and 16d), the second pixels (ex. 18a, 18b, 18c and 18d), and the third pixels (ex. 20a, 20b, 20c and 20d) along the pixel-arrangement direction 22a is exemplary.

In FIG. 10, the central pixel 14a, the first pixel 16a, the second pixel 18a and the third pixel 20a include green (G) color filters 22. The central pixel 14b, the first pixel 16b, the second pixel 18b and the third pixel 20b include red (R) color filters 24. The central pixel 14c, the first pixel 16c, the second pixel 18c and the third pixel 20c include blue (B) color filters 26. The central pixel 14d, the first pixel 16d, the second pixel 18d and the third pixel 20d include green (G) color filters 22. In some embodiments, other arrangements of the R/G/B color filters (22, 24 and 26) in the pixels are also suitable in the present invention. Here, the central pixel 14a, the first pixel 16a, the second pixel 18a and the third pixel 20a are exemplary for demonstrating various subpixel structures thereamong.

Referring to FIGS. 10 and 11, the central pixel 14a includes a plurality of metal grids 28, a patterned first organic layer 30, a color filter 32, and a second organic layer 34. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. Each of the first pixel 16a, the second pixel 18a and the third pixel 20a includes a plurality of metal grids 28, a patterned first organic layer 30, a color filter 32, a second organic layer 34, and a light collection element 36. The metal grids 28 are formed on the substrate 12. The patterned first organic layer 30 is formed on the metal grids 28. The color filter 32 is surrounded by the patterned first organic layer 30. The second organic layer 34 is formed on the patterned first organic layer 30 and the color filter 32. The light collection element 36 is surrounded by the second organic layer 34. Specifically, the refractive index of the light collection element 36 is greater than that of the second organic layer 34. Therefore, no light collection element is disposed in the central pixel 14a. In addition, for the first pixel 16a, the second pixel 18a and the third pixel 20a, a first distance "D1" between the central point "$P_S$" of the first pixel 16a and the central point "$P_L$" of the light collection element 36 is defined. A second distance "D2" between the central point "$P_S$" of the second pixel 18a and the central point "$P_L$" of the light collection element 36 is defined. A third distance "D3" between the central point "$P_S$" of the third pixel 20a and the central point "$P_L$" of the light collection element 36 is defined.

In FIGS. 10 and 11, the first distance "D1", the second distance "D2" and the third distance "D3" are different thereamong. Referring to FIG. 10, the central point "$P_L$" of the light collection element 36 in the first pixel 16a departs from the central point "$P_S$" of the first pixel 16a along a direction 42. The central point "$P_L$" of the light collection element 36 in the second pixel 18a departs from the central point "$P_S$" of the second pixel 18a along the direction 42. The central point "$P_L$" of the light collection element 36 in the third pixel 20a departs from the central point "$P_S$" of the third pixel 20a along the direction 42. Specifically, the departure direction 42 represents the direction in which the central points "$P_L$" of the light collection elements 36 depart diagonally from the central points "$P_S$" to the top right of the first pixel 16a, the second pixel 18a and the third pixel 20a respectively. Here, the central pixel 14a, the first pixel 16a, the second pixel 18a, and the third pixel 20a are arranged along the pixel-arrangement direction 22a (i.e. a direction that the pixels are arranged diagonally from the center to the bottom left of the substrate 12), as shown in FIG. 1. Therefore, the direction 42 is opposite to the pixel-arrangement direction 22a. In FIGS. 10 and 11, the third distance "D3" in the third pixel 20a is greater than the second distance "D2" in the second pixel 18a. The second distance "D2" in the second pixel 18a is greater than the first distance "D1" in the first pixel 16a. The first distance "D1" in the first pixel 16a is greater than zero.

In FIGS. 10 and 11, for the first pixel 16a, the second pixel 18a and the third pixel 20a, a first width "W1" of the light collection element 36 in the first pixel 16a is defined. A second width "W2" of the light collection element 36 in the second pixel 18a is defined. A third width "W3" of the light collection element 36 in the third pixel 20a is defined. Specifically, the third width "W3" of the light collection element 36 in the third pixel 20a is greater than the second width "W2" of the light collection element 36 in the second pixel 18a. The second width "W2" of the light collection element 36 in the second pixel 18a is greater than the first width "W1" of the light collection element 36 in the first pixel 16a. In some embodiments, the first width "W1" of the light collection element 36 in the first pixel 16a is greater than zero. The third width "W3" of the light collection element 36 in the third pixel 20a is smaller than the width "W" of the third pixel 20a. The light collection element 36 in the third pixel 20a extends further over the patterned first organic layer 30, as shown in FIG. 11. In addition, a first area "A1" of the light collection element 36 in the first pixel 16a is defined. A second area "A2" of the light collection element 36 in the second pixel 18a is defined. A third area "A3" of the light collection element 36 in the third pixel 20a is defined. Similarly, the third area "A3" of the light collection element 36 in the third pixel 20a is greater than the second area "A2" of the light collection element 36 in the second pixel 18a. The second area "A2" of the light collection element 36 in the second pixel 18a is greater than the first area "A1" of the light collection element 36 in the first pixel 16a.

In FIG. 11, for the first pixel 16a, the second pixel 18a and the third pixel 20a, the first thickness "T1" of the light collection element 36 in the first pixel 16a is defined. The second thickness "T2" of the light collection element 36 in the second pixel 18a is defined. The third thickness "T3" of the light collection element 36 in the third pixel 20a is defined. Specifically, the third thickness "T3" of the light collection element 36 in the third pixel 20a is greater than the second thickness "T2" of the light collection element 36 in the second pixel 18a. The second thickness "T2" of the light collection element 36 in the second pixel 18a is greater than the first thickness "T1" of the light collection element 36 in the first pixel 16a. In FIG. 11, the second thickness "T2" of the light collection element 36 in the second pixel 18a is greater than the thickness "$T_L$" of the second organic layer 34. In some embodiments, the light collection elements 36 respectively in the first pixel 16a, the second pixel 18a and the third pixel 20a are further covered by the second organic layer 34 (not shown).

In some embodiments, the patterned first organic layer 30 has a refractive index which is in a range from about 1.2 to about 1.45. In some embodiments, the refractive index of the light collection element 36 is greater than that of the color filter 32. In some embodiments, the refractive index of the light collection element 36 is in a range from about 1.6 to about 1.9. In some embodiments, each of the central pixel 14a, the first pixel 16a, the second pixel 18a and the third pixel 20a further includes an oxide layer 38 which covers the metal grids 28. In some embodiments, each of the central pixel 14a, the first pixel 16a, the second pixel 18a and the third pixel 20a further includes an anti-reflection layer 40 formed on the second organic layer 34. In some embodiments, the refractive index of the light collection element 36 is greater than that of the anti-reflection layer 40.

In the present invention, high-refractive-index (n=1.6-1.9) light collection elements with specific dimensions or positions are disposed above color filters. For the dimension requirement, the width (or thickness) of the light collection element disposed in the pixel far from the central pixel is greater than that of the light collection element disposed in the pixel adjacent to the central pixel. For the position requirement, the distance between the central point of the pixel and the central point of the light collection element (i.e. the departure distance of the light collection element from the central point of the pixel) in the pixel far from the central pixel is greater than that between the central point of the pixel and the central point of the light collection element in the pixel adjacent to the central pixel. Specifically, the departure direction of the light collection elements is opposite to the pixel-arrangement direction. Also, the departure direction of the light collection elements in the pixels is correspondingly altered in accordance with various pixel-arrangement directions. In addition, the refractive index of the light collection element is higher than that of adjacent materials. By disposing the specific light collection element, QE peaks of color filters are thus significantly improved, especially for pixels located in the peripheral region of the substrate.

Example 1

QE Peak Improvement of the Optical Device

Figure 12:
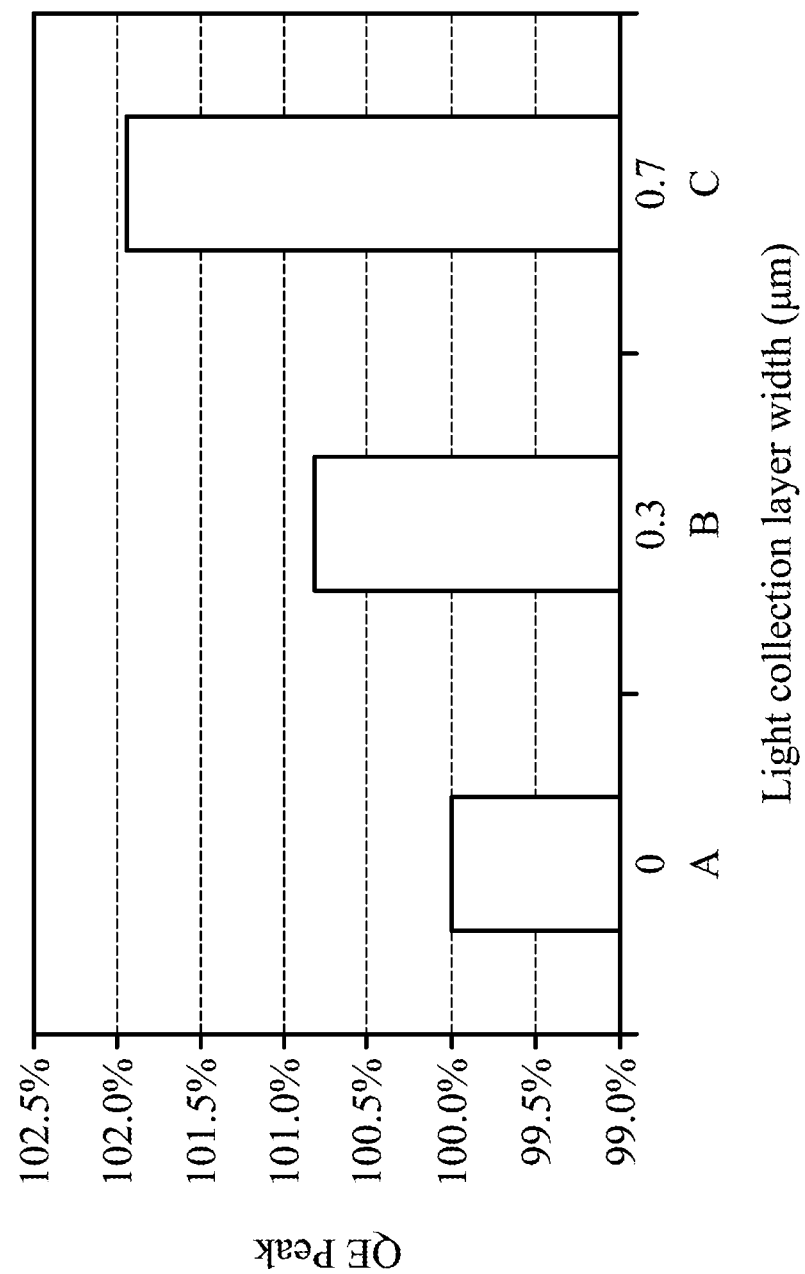
FIG. 12 shows a QE peak of an optical device in accordance with one embodiment of the invention.

In this example, improvement of a QE peak, especially for pixels located in the peripheral region of the substrate, is acknowledged by disposing a light collection element (i.e. a high-refractive-index layer) with a specific dimension in an optical device. Referring to FIG. 12, the column "A" shows a QE peak (R/G/B) of a WGCF-type optical device without disposing a light collection element therein. The column "B" shows a QE peak (R/G/B) of a WGCF-type optical device with a light collection element having a width of 0.3 μm. The column "C" shows a QE peak (R/G/B) of a WGCF-type optical device with a light collection element having a width of 0.7 μm. The QE peak (column "C") built by the WGCF-type optical device with the wider light collection layer shows that the QE peak of the optical device is a significant improvement of about 1.3% over column "B", and about 2.0% over column "A".

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical device, comprising:
   a central region having a plurality of central pixels;
   a first region having a plurality of first pixels;
   a second region having a plurality of second pixels, wherein the central region, the first region and the second region are spaced from each other along an arrangement direction, and the first region is closer to the central region than the second region;
   an organic layer formed in the central region, the first region and the second region;
   a light collection layer surrounded by the organic layer formed in the first region and the second region;
   a first light collection element of the light collection layer formed in each of the plurality of first pixels; and
   a second light collection element of the light collection layer formed in each of the plurality of second pixels, wherein the first light collection element is different from the second light collection element.

2. The optical device as claimed in claim 1, wherein there is a first distance between a center of the first pixel and a center of the first light collection element, and there is a second distance between a center of the second pixel and a center of the second light collection element, and
   the second distance is greater than the first distance, the center of the first light collection element departs from the center of the first pixel along a direction opposite to the arrangement direction of the central region, the first region and the second region, and the center of the second light collection element departs from the center of the second pixel along the direction opposite to the arrangement direction of the central region, the first region and the second region.

3. The optical device as claimed in claim 1, wherein there is a first distance between a center of the first pixel and a center of the first light collection element, and there is a second distance between a center of the second pixel and a center of the second light collection element, and the first distance is the same as the second distance.

4. The optical device as claimed in claim 3, wherein the second light collection element has a width which is greater than that of the first light collection element.

5. The optical device as claimed in claim 4, wherein the width of the first light collection element is greater than zero, and the width of the second light collection element is less than a width of the second pixel.

6. The optical device as claimed in claim 3, wherein the second light collection element has an upper surface area which is greater than that of the first light collection element.

7. The optical device as claimed in claim 3, wherein the second light collection element has a thickness which is greater than that of the first light collection element.

8. The optical device as claimed in claim 7, wherein the thickness of the second light collection element is greater than that of the organic layer.

9. The optical device as claimed in claim 8, wherein the first light collection element and the second light collection element are further covered by the organic layer.

10. The optical device as claimed in claim 3, wherein a part of the second light collection element extends further into a color filter underneath the second light collection element.

11. The optical device as claimed in claim 10, wherein the part of the second light collection element that extends into the color filter has a thickness that is less than one third of that of the color filter.

12. The optical device as claimed in claim 2, wherein the second light collection element has a width which is greater than that of the first light collection element, and the second light collection element has a thickness which is greater than that of the first light collection element.

13. The optical device as claimed in claim 12, wherein the second light collection element extends further over a patterned organic layer surrounding a color filter underneath the second light collection element.

14. The optical device as claimed in claim 13, wherein the patterned organic layer has a refractive index which is in a range from about 1.2 to about 1.45.

15. The optical device as claimed in claim 1, wherein the first light collection element and the second light collection element have a refractive index which is greater than those of color filters respectively underneath the first light collection element and the second light collection element.

16. The optical device as claimed in claim 1, wherein the first light collection element and the second light collection element have a refractive index which is in a range from about 1.6 to about 1.9.

17. The optical device as claimed in claim 1, further comprising an anti-reflection layer formed on the organic layer, the first light collection element and the second light collection element.

18. The optical device as claimed in claim 17, wherein the first light collection element and the second light collection element have a refractive index which is greater than that of the anti-reflection layer.

* * * * *